(12) United States Patent
Fisher et al.

(10) Patent No.: US 6,711,029 B2
(45) Date of Patent: Mar. 23, 2004

(54) LOW TEMPERATURE CO-FIRED CERAMIC WITH IMPROVED SHRINKAGE CONTROL

(75) Inventors: Phillip S. Fisher, Attica, IN (US); Charles O. Jordan, West Lafayette, IN (US); Paul N. Shepherd, West Lafayette, IN (US)

(73) Assignee: CTS Corporation, Elkhart, IN (US)

( * ) Notice: Subject to any disclaimer, the term of this patent is extended or adjusted under 35 U.S.C. 154(b) by 0 days.

(21) Appl. No.: 10/153,127

(22) Filed: May 21, 2002

(65) Prior Publication Data

US 2003/0218870 A1 Nov. 27, 2003

(51) Int. Cl.[7] .............................. H05K 1/11; H05K 1/14
(52) U.S. Cl. ........................................ 361/792; 361/795
(58) Field of Search .............................. 361/764–766, 361/792–795, 321.1, 321.2; 174/255–260; 438/618–623; 428/209–210; 29/830–831

(56) References Cited

U.S. PATENT DOCUMENTS

| | | | |
|---|---|---|---|
| 4,800,459 A | * 1/1989 | Takagi et al. ............. | 361/321.2 |
| 5,028,473 A | 7/1991 | Vitriol | |
| 5,396,397 A | 3/1995 | McClanahan et al. | |
| 5,518,969 A | 5/1996 | Ragan | |
| 5,579,207 A | 11/1996 | Hayden | |
| 5,644,327 A | 7/1997 | Onyskevych | |
| 5,937,321 A | * 8/1999 | Beck et al. .................. | 438/622 |
| 5,990,028 A | 11/1999 | Roethlingshoefer | |
| 6,153,290 A | * 11/2000 | Sunahara .................... | 428/210 |
| 6,205,032 B1 | 3/2001 | Shepherd | |
| 6,337,123 B1 | * 1/2002 | Ryugo et al. ............... | 428/210 |
| 6,468,640 B2 | * 10/2002 | Nishide et al. ............. | 428/210 |
| 6,560,860 B2 | * 5/2003 | Shepherd .................... | 29/830 |

* cited by examiner

*Primary Examiner*—Evon Pert
*Assistant Examiner*—Tuan Dinh
(74) *Attorney, Agent, or Firm*—Mark Bourgeois

(57) ABSTRACT

A low temperature co-fired ceramic assembly (LTCC) with a constraining core of differing dielectric constants that minimizes shrinkage of the outer ceramic layers during firing. The ceramic assembly has a planar ceramic core. The core has a first ceramic layer with a first dielectric constant and a second ceramic layer adjacent to the first ceramic layer. The second ceramic layer has a second dielectric constant. A third ceramic layer has a third dielectric constant. A fourth ceramic layer has a fourth dielectric constant. The ceramic core is located between the third and the fourth ceramic layers. Several electrically conductive vias extend through the first, second, third and fourth ceramic layers. Several circuit features are located on the first, second, third and fourth ceramic layers. The vias electrically connect the circuit features on the layers.

12 Claims, 3 Drawing Sheets

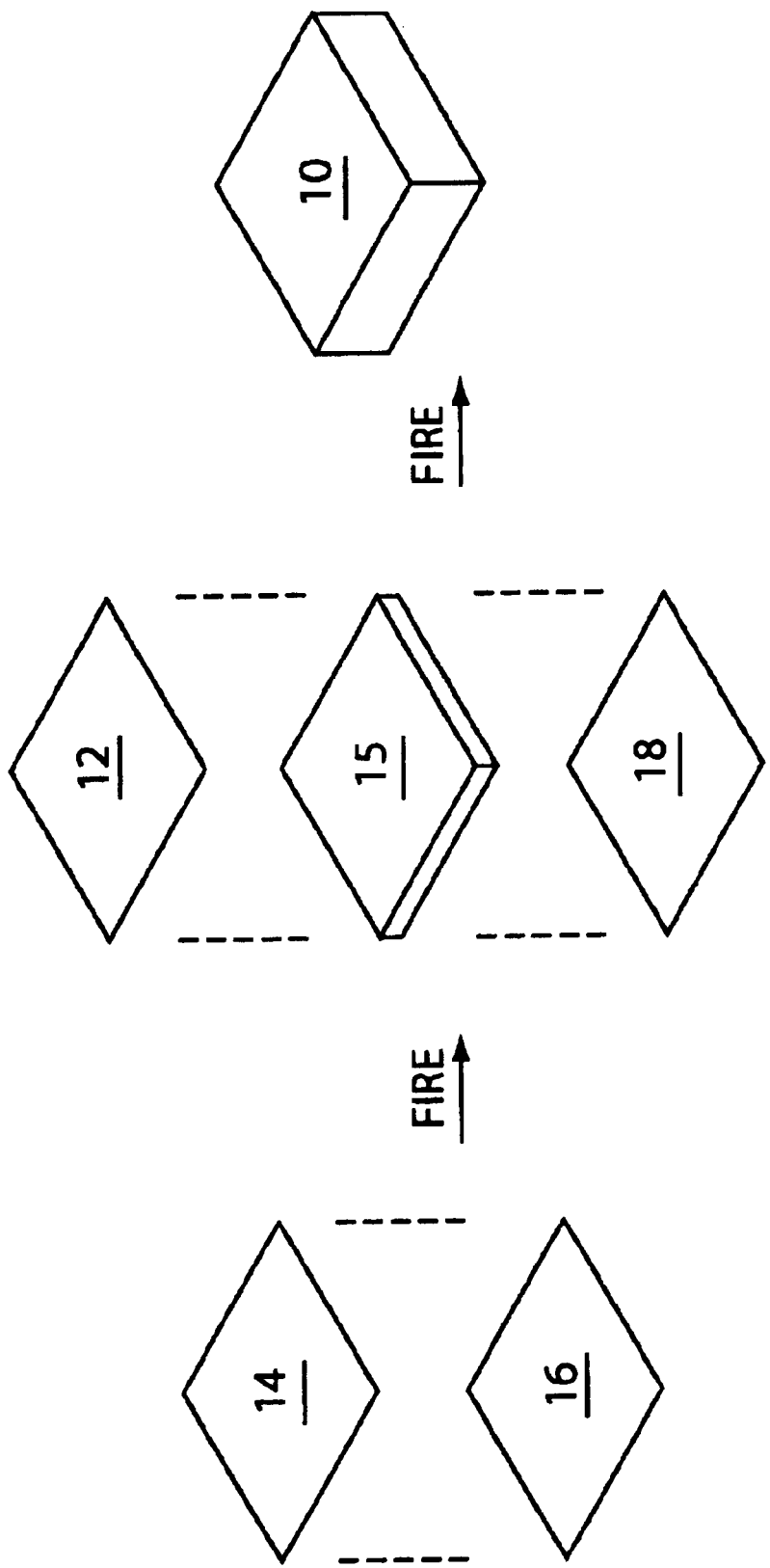

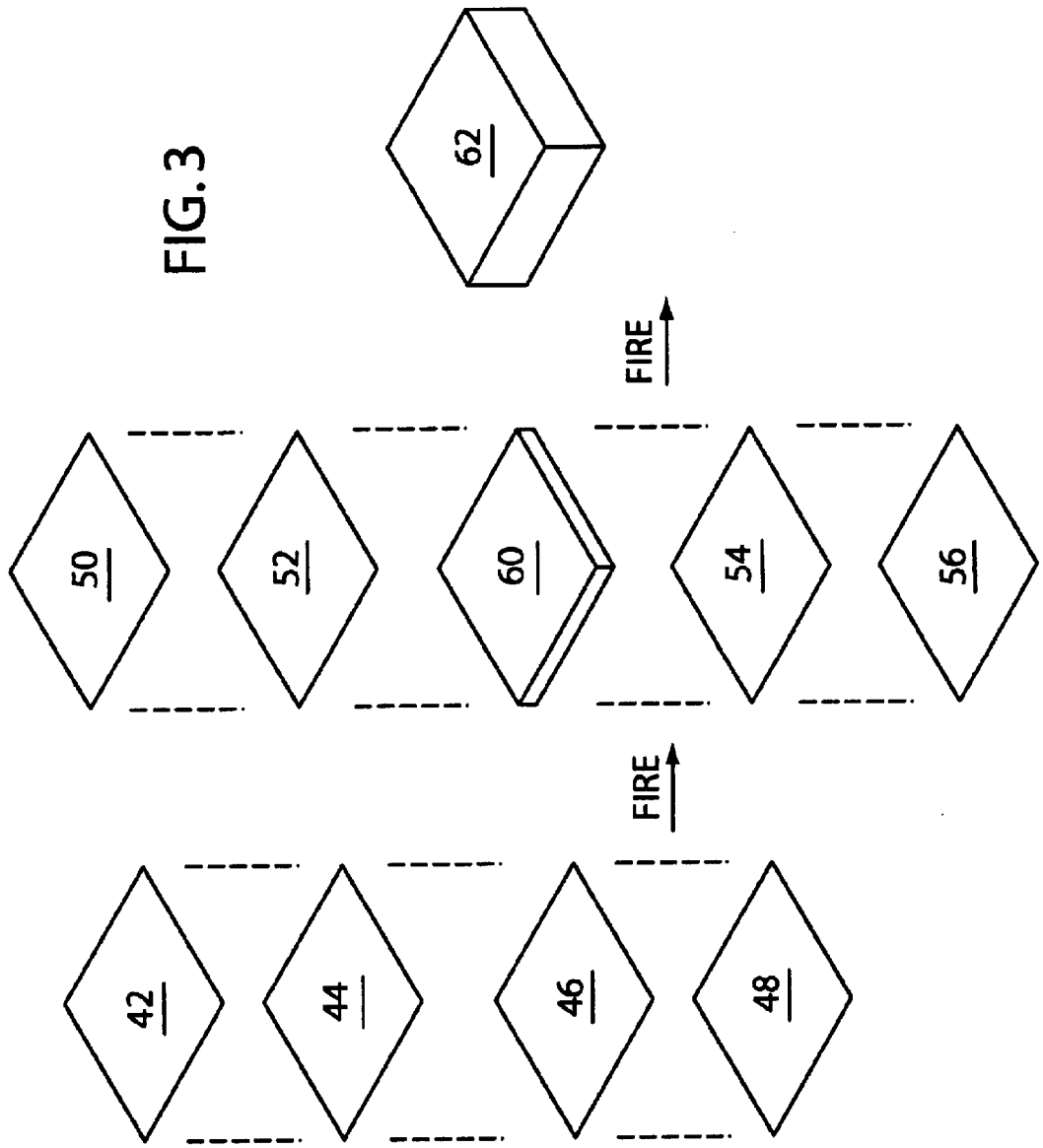

LOW TEMPERATURE CO-FIRED CERAMIC WITH IMPROVED SHRINKAGE CONTROL

CROSS-REFERENCE TO RELATED AND CO-PENDING APPLICATIONS AND PATENTS

This application is related to U.S. Pat. No. 6,205,032.

BACKGROUND

1. Field of the Invention

This invention generally relates to ceramic electronic packaging. Specifically, there is a multilayered low temperature co-fired ceramic assembly (LTCC) with a constraining core to minimize shrinkage of outer ceramic layers during firing. The ceramic layers have different dielectric constants to allow fabrication of high density capacitors and other electronic components.

2 Description of Related Art

Various devices are well known for providing ceramic packages for semiconductor devices and passive components. One of the prior art designs is a low temperature co-fired ceramic (LTCC) substrate. The LTCC ceramic is made of layers of ceramic material, which in an unfired state, are called green tapes. Circuit lines, resistors, capacitors, bonding pads and vias are created on the surface and in holes of the green tapes by conventional thick film screening techniques. The layers are stacked on top of each other laminated and fired at a relatively low temperature in a furnace. During firing, the LTCC shrinks along the x, y and z axes typically 10–25 percent depending upon the LTCC formulation.

Despite the advantages of the prior art LTCC designs, problems occur with the registration or alignment of the circuit lines and components on the exterior surfaces during manufacturing. During firing, the shrinkage of the LTCC causes the external features to vary with respect to true position. This true position error can cause misalignment when attaching components or printing post-fire materials, resulting in a defective part that is non-repairable and has to be discarded.

Another problem with LTCC electronic packages occurs in the fabrication of buried capacitors within the package. It is desirable to have a high dielectric constant between capacitor electrodes so that a given capacitance can be achieved without large electrodes. At the same time, it is desirable for the circuit lines that attach to the capacitor electrodes to be located on a low dielectric constant substrate to reduce unwanted parasitic effects such as coupling to other lines or embedded components.

Several attempts have been made in the prior art to solve some of these problems. U.S. Pat. No. 5,518,969, shows a process for producing low shrink ceramic compositions. U.S. Pat. No. 5,144,526, shows a low temperature co-fired ceramic structure containing buried capacitors. U.S. Pat. No. 5,745,334, shows a capacitor formed within a printed circuit board. None of these patents have been able to overcome all of the problems of the prior art.

SUMMARY

It is a feature of the invention to provide a low temperature co-fired ceramic assembly (LTCC) with a constraining core of differing dielectric constants to minimize shrinkage of outer ceramic layers during firing.

A further feature of the invention is to provide a multilayered low temperature co-fired ceramic assembly including a planar ceramic core. The core has a first ceramic layer with a first dielectric constant and a second ceramic layer adjacent to the first ceramic layer. The second ceramic layer has a second dielectric constant. A third ceramic layer has a third dielectric constant. A fourth ceramic layer has a fourth dielectric constant. The ceramic core is located between the third and the fourth ceramic layers. Several electrically conductive vias extend through the first, second, third and fourth ceramic layers. Several circuit features are located on the first, second, third and fourth ceramic layers. The vias electrically connect the circuit features on the layers.

BRIEF DESCRIPTION OF THE DRAWINGS

FIG. 2 is a diagram showing an assembly sequence of the assembly of FIG. 1.

FIG. 3 is a diagram showing an alternative assembly sequence.

Figure 1:
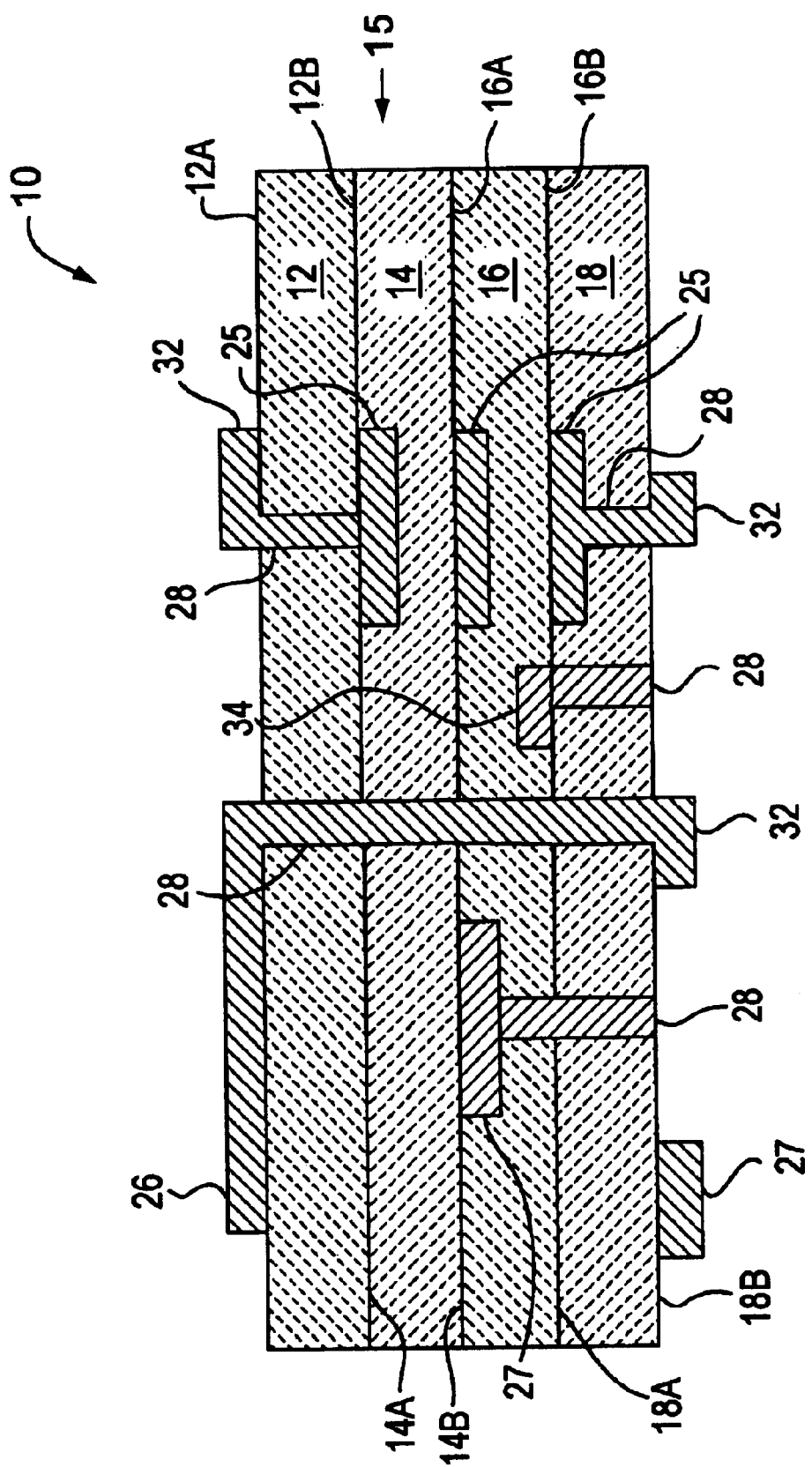
FIG. 1 is a side cross sectional view of the preferred embodiment of a low temperature co-fired ceramic assembly (LTCC) with improved registration.

It is noted that the drawings of the invention are not to scale.

DETAILED DESCRIPTION

Referring to FIGS. 1 and 2, a multilayered low temperature co-fired ceramic (LTCC) assembly 10 is shown. LTCC ceramic layers 14 and 16 have outer surfaces 14A, 14B and 16A and 16B, respectively. Layers 14 and 16 are conventional LTCC green tapes. An example of layers 14 and 16 is 951 Green Tape (tm) commercially available from Dupont Corporation, Electronic Materials Division, Wilmington, Del. Layers 12 and 18, by themselves, shrink from 8 to 12 percent during firing in all axes (both in plane and perpendicular to the layer). Layers 14 and 16 can have different dielectric constants or the same dielectric constants. For example, layers 14 and 16 can have dielectric constants that typically range from 4 to 2000.

Various circuit features can be included on layers 14 and 16 if desired. The circuit features patterned on layers 14 and 16 are called non-critically shrinking circuit features. They are larger in dimension, spaced farther apart and have lesser registration requirements than the circuit features on the other layers. A buried resistor 27 is shown on surface 16A. A via 28 connects resistor 27 with bottom surface 18B. A buried inductor 34 is shown on surface 16B. Another via 28 connects inductor 34 to bottom surface 18B. Capacitor electrodes 25 are shown on layers 14 and 16. These are some examples of the circuit features and components that can be fabricated on assembly 10. Resistors 27, inductor 34 and vias 28 are made from conventional thick film conductor materials and are applied by conventional thick film screening and curing techniques. After circuit features have been applied, layers 14 and 16 would be stacked on top of each other or laminated and fired in a furnace to form a ceramic core 15.

LTCC ceramic layers 12 and 18 have outer surfaces 12A, 12B and 18A and 18B, respectively. Layers 12 and 18 are conventional LTCC green tapes. An example of layers 12 and 18 is 951 Green Tape (tm) commercially available from Dupont Corporation, Electronic Materials Division, Wilmington, Del. Layers 12 and 18 can have different dielectric constants or the same dielectric constants. For example, layers 12 and 18 can have dielectric constants that typically range from 5 to 60.

Capacitor electrodes 25 are located on surface 12A, 12B, 14B and 16B. Electrodes 25 form a capacitor. A via 28 connects buried electrode 25 to bond pad 32 on outer surface 18B. A circuit line 26 is located on surface 12A. Via 28 connects an end of circuit line 26 to bond pad 32 on outer surface 18B. Bond pads 32 can connect to a semiconductor device if desired. A resistor 27 is shown on surface 18B. Circuit lines 26, bond pads 32 and vias 28 connect with other circuit lines (not shown) or components (not shown) on the LTCC device 10. The circuit features on layers 12 and 18 are made from conventional thick film conductor materials and are applied by conventional thick film screening and curing techniques. These circuit features and components on layers 12 and 18 are patterned in a high density configuration with small dimensions and have to be held to precise tolerances for post-fire processing. If shrinkage is not precisely controlled, post-fire materials or placed components will be mis-registered, resulting in an electrical open or short.

After circuit features have been applied to layers 12 and 18, ceramic core 15 is stacked on layer 18 and layer 12 is stacked or laminated on top of ceramic core 15 to form assembly 10. The assembly 10 is typically laminated in a press. Assembly 10 is then fired in a furnace to form assembly 10. Again, these circuit features and components have to be held to precise registration and tolerance. In the case of a mis-alignment among the circuit components, an open or a short may result. The combination of the fired ceramic core 15 between the layers 12 and 18 causes a change in the shrinkage rate of the layers 12 and 18 during firing. Layers 12 and 18 shrink less than 1.0 percent in the x and y axes (parallel to the planar layer) during firing. Layers 12 and 18 do not shrink at their normal 10 to 25 percent rate in the z-axis direction. Layers 12 and 18 shrink at a much higher rate in the z-axis (perpendicular to the planar layers) of about 40 to 60 percent in order to arrive at a normal density after firing. Layers 12 and 18 shrink as to conserve mass. The ceramic core 15 maintains its fired dimensions or shrinks slightly on the order of less than 1.0 percent in the x, y and z axes. Ceramic core 15 constrains the shrinkage of layers 12 and 18 to that of the ceramic core 15 in the x and y directions. The resulting assembly 10 after firing is able to have higher densities, smaller dimensions and better hold registration and tolerances for circuit features placed on layers 12, 14, 16 and 18. The better registration results in improved yields, better quality, less rejects, less scrap and lower costs of manufacturing.

Using a mix of layers with different dielectric constants allows a greater range of electronic component values to be fabricated on assembly 10. For example, if layers 14 and 16 have a dielectric constant of 50.0, capacitor electrodes that are 100 by 100 mils, layer 12 is 1.7 mils thick and there are 3 plates as shown in FIG. 1. Then a capacitance of 132 picofarads is obtained. Using higher dielectric constants allows capacitors of larger capacitance values to be buried within assembly 10.

At the same time, using a lower dielectric constant material with a dielectric constant such as 7.0 on layers 12 and 18 provides for less cross talk noise and electromagnetic coupling from devices and circuit lines on layers 12 and 18 to adjacent and buried circuit lines and devices. Using a different dielectric constant on different layers also allows the impedance of circuit lines 26 to be adjusted for a given line width. LTCC assembly 10, of FIGS. 1 and 2 can be assembled as follows: The first step is to punch vias 28 into layers 12, 14, 16 and 18. The vias 28 are then screen filled with a conductive material on each of layers 12, 14, 16 and 18. Next, electrodes 25, resistors 27, circuit lines 26, bond pads 32 and inductors 34 would be screened onto surfaces 12A, 12B, 14A, 14B, 16A, 16B, 18A and 18B. Layers 14 and 16 would be stacked and laminated under heat and pressure onto each other. Layers 14 and 16 are fired in a furnace at a temperature between 700 and 1000 degrees Celsius to form ceramic core 15.

Ceramic core 15 is stacked onto layer 18 and layer 12 is stacked onto ceramic core 15. Next, Layers 12, 18 and core 15 are laminated under heat and pressure. Layers 12, 18 and ceramic core 15 are fired in a furnace at a temperature between 700 and 1000 degrees Celsius to complete assembly 10.

Turning now to FIG. 3, an alternative assembly sequence of a multilayered low temperature co-fired ceramic (LTCC) assembly 62 is shown. Assembly 62 is similar to assembly 10 except that it has more ceramic layers with differing dielectric constants.

Layers 42, 44, 46, 48, 50, 52, 54 and 56 are conventional LTCC green tapes. Layers 42, 44, 46, 48, 50, 52, 54 (42–54) can have different dielectric constants or some of the layers may have the same dielectric constants. The layers 42–54 can have dielectric constants that typically range from 4 to 2000. For example, the layers could have the following dielectric constants:

| Layer | Dielectric Constant |
| --- | --- |
| 42 | 35 |
| 44 | 50 |
| 46 | 50 |
| 48 | 35 |
| 50 | 7 |
| 52 | 20 |
| 54 | 20 |
| 56 | 7 |

Layers 42–54 would have circuit features and vias applied the same as for assembly 10. Layers 42, 44, 46 and 48 are stacked, laminated and fired to form a ceramic core 60. Next, layers 54 and 56 are stacked and core 60 placed on top. Next, layers 52 and 50 are stacked onto core 60 to form ceramic assembly 62. Assembly 62 is laminated in a press and fired in a furnace. The ceramic layers in assembly 62 having differing dielectric constants allows the fabrication of a wider range of capacitance and component values.

One of ordinary skill in the arts electronic packaging and electronic ceramics, will realize many advantages from using the preferred embodiment. Further, one of ordinary skill in the art will realize that there are many different ways of accomplishing the preferred embodiment. For example, it is contemplated that more than two layers 14 and 16 could be stacked to form core 15. Similarly, more than two layers 12 and 18 could be stacked on core 15. It also is possible to stack several units of assembly 10 on each other and then fire the overall unit.

Even though the embodiment discusses the use of certain circuit features, other circuit features or passive elements could be used such as waveguides, resonators, or mixers. Other circuit features could be included like coupled structures such as baluns mutual inductors or directional couplers. Further, it is contemplated that semiconductor devices could be mounted on the outer surfaces 12A or 18A.

While the invention has been taught with specific reference to these embodiments, someone skilled in the art will recognize that changes can be made in form and detail without departing from the spirit and the scope of the invention. The described embodiments are to be considered in all respects only as illustrative and not restrictive. The scope of the invention is, therefore, indicated by the appended claims rather than by the foregoing description. All changes that come within the meaning and range of equivalency of the claims are to be embraced within their scope.

What is claimed is:

1. A multilayered low temperature co-fired ceramic assembly comprising:
   a) a planar ceramic core including:
      a1) a second ceramic layer having a second dielectric constant;
      a2) a third ceramic layer adjacent to the second ceramic layer, the third ceramic layer having a second third dielectric constant, the ceramic core shrinking in three axes during firing;
   b) a first ceramic layer having a first dielectric constant;
   c) a fourth ceramic layer having a fourth dielectric constant, the ceramic core located between the first and the fourth ceramic layers, the first and fourth ceramic layers shrinking during firing so as to converse mass in a direction perpendicular to the layers;
   d) a plurality of electrically conductive vias, one of the conductive vias extending through at least two of the first, second, third and fourth ceramic layers; and
   e) a plurality of circuit features located on the first, second, third and fourth ceramic layers, the vias electrically connecting the circuit features on the layers.

2. The multilayered low temperature co-fired ceramic assembly according to claim 1, wherein the circuit features are selected from the group consisting of:
   a) resistors;
   b) capacitors;
   c) circuit lines;
   d) inductors;
   e) bond pads; or
   f) coupled structures.

3. The multilayered low temperature co-fired ceramic assembly according to claim 1, wherein the first dielectric constant has a value between 4 and 2000.

4. The multilayered low temperature co-fired ceramic assembly according to claim 1, wherein the second dielectric constant has a value between 4 and 2000.

5. The multilayered low temperature co-fired ceramic assembly according to claim 1, wherein the third dielectric constant has a value between 4 and 2000.

6. The multilayered low temperature co-fired ceramic assembly according to claim 1, wherein the fourth dielectric constant has a value between 4 and 2000.

7. The multilayered low temperature co-fired ceramic assembly according to claim 1, wherein the first and fourth dielectric constants are the same.

8. The multilayered low temperature co-fired ceramic assembly according to claim 1, wherein the second and third dielectric constants are the same.

9. The multilayered low temperature co-fired ceramic assembly according to claim 1, wherein the first and fourth ceramic layers shrink less than 1.0% in a direction parallel to the planar layers.

10. The multilayered ceramic assembly according to claim 1, wherein the second and third ceramic layers have a high dielectric constant and the first and fourth ceramic layers have a low dielectric constant.

11. The multilayered ceramic assembly according to claim 1, wherein the ceramic core is subjected to a first oven firing and the combination of the ceramic core and the first and fourth ceramic layers is subjected to a second oven firing to produce the multilayered ceramic assembly.

12. The multilayered ceramic assembly according to claim 11, wherein the first and fourth ceramic layers are constrained from shrinking in at least two axes by the ceramic core during the second oven firing.

* * * * *